United States Patent
Senda et al.

(10) Patent No.: US 10,490,393 B2
(45) Date of Patent: *Nov. 26, 2019

(54) TANTALUM SPUTTERING TARGET AND METHOD FOR PRODUCING SAME

(71) Applicant: JX Nippon Mining & Metals Corporation, Tokyo (JP)

(72) Inventors: Shinichiro Senda, Ibaraki (JP); Kotaro Nagatsu, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 475 days.

This patent is subject to a terminal disclaimer.

(21) Appl. No.: 14/433,948

(22) PCT Filed: Dec. 6, 2013

(86) PCT No.: PCT/JP2013/082764
§ 371 (c)(1),
(2) Date: Apr. 7, 2015

(87) PCT Pub. No.: WO2014/097897
PCT Pub. Date: Jun. 26, 2014

(65) Prior Publication Data
US 2015/0279637 A1  Oct. 1, 2015

(30) Foreign Application Priority Data
Dec. 19, 2012  (JP) ................................ 2012-276883

(51) Int. Cl.
| | |
|---|---|
| *C22F 1/18* | (2006.01) |
| *C23C 14/16* | (2006.01) |
| *C22C 27/02* | (2006.01) |
| *H01J 37/34* | (2006.01) |
| *C01B 21/06* | (2006.01) |
| *C23C 14/34* | (2006.01) |
| *H01L 21/285* | (2006.01) |
| *H01L 21/768* | (2006.01) |
| *H01L 23/532* | (2006.01) |

(52) U.S. Cl.
CPC ...... *H01J 37/3426* (2013.01); *C01B 21/0617* (2013.01); *C22C 27/02* (2013.01); *C22F 1/18* (2013.01); *C23C 14/16* (2013.01); *C23C 14/3414* (2013.01); *H01L 21/2855* (2013.01); *H01L 21/76841* (2013.01); *H01L 23/53238* (2013.01); *H01L 2924/0002* (2013.01)

(58) Field of Classification Search
CPC ..... C22C 27/02; C23C 14/3414; C23C 14/16; C01B 21/0617; C22F 1/18; H01J 37/3426; H01L 23/53238

USPC .......................................................... 148/422
See application file for complete search history.

(56) References Cited

U.S. PATENT DOCUMENTS

| | | |
|---|---|---|
| 6,348,139 B1 | 2/2002 | Shah et al. |
| 6,794,753 B2 | 9/2004 | Bell |
| 7,081,148 B2 | 7/2006 | Koenigsmann et al. |
| 7,156,963 B2 | 1/2007 | Oda |
| 7,686,926 B2 | 3/2010 | Gung |
| 7,699,948 B2 | 4/2010 | Oda |
| 7,716,806 B2 | 5/2010 | Oda |
| 7,740,717 B2 | 6/2010 | Oda |
| 7,892,367 B2 | 2/2011 | Oda |
| 8,172,960 B2 | 5/2012 | Oda et al. |
| 8,177,947 B2 | 5/2012 | Miyashita |
| 8,231,745 B2 | 7/2012 | Wickersham, Jr. et al. |
| 8,425,696 B2 | 4/2013 | Oda et al. |
| 8,481,859 B2 | 7/2013 | Haq et al. |
| 8,871,064 B2 | 10/2014 | Gung |
| 2002/0153248 A1* | 10/2002 | Shah ..................... B21J 5/00 204/298.13 |
| 2007/0023281 A1* | 2/2007 | Oda ................. C23C 14/3414 204/298.12 |
| 2009/0078580 A1 | 3/2009 | Yoshihama et al. |
| 2011/0266145 A1 | 11/2011 | Fukushima et al. |
| 2012/0031756 A1 | 2/2012 | Fukushima et al. |
| 2012/0037501 A1 | 2/2012 | Fukushima et al. |
| 2012/0061672 A1 | 3/2012 | O'Rourke et al. |
| 2012/0132523 A1 | 5/2012 | Hagihara et al. |
| 2012/0267236 A1 | 10/2012 | Nakashima et al. |
| 2013/0092534 A1 | 4/2013 | Senda et al. |
| 2013/0098759 A1 | 4/2013 | Senda et al. |
| 2014/0242401 A1 | 8/2014 | Senda et al. |
| 2015/0064056 A1 | 3/2015 | Nagatsu et al. |
| 2015/0329959 A1 | 11/2015 | Senda et al. |
| 2015/0348765 A1 | 12/2015 | Senda et al. |
| 2016/0208377 A1 | 7/2016 | Oda |
| 2016/0217983 A1 | 7/2016 | Oda |

FOREIGN PATENT DOCUMENTS

| | | |
|---|---|---|
| EP | 0902102 A1 | 3/1999 |
| JP | 2002-363736 A | 12/2002 |
| JP | 2004-027358 A | 1/2004 |
| JP | 2007-126748 A | 5/2007 |
| WO | 2009/107763 A1 | 9/2009 |

* cited by examiner

*Primary Examiner* — Brian D Walck
(74) *Attorney, Agent, or Firm* — Howson & Howson LLP

(57) ABSTRACT

A tantalum sputtering target, wherein, on a sputtering surface of the tantalum sputtering target, an orientation rate of a (200) plane exceeds 70%, an orientation rate of a (222) plane is 30% or less. By controlling the crystal orientation of the target, effects are yielded in that the discharge voltage of the tantalum sputtering target can be reduced so that plasma can be more easily generated, and the voltage drift during deposition can be suppressed.

8 Claims, No Drawings

TANTALUM SPUTTERING TARGET AND METHOD FOR PRODUCING SAME

BACKGROUND

The present invention relates to a tantalum sputtering target and a method for producing such a tantalum sputtering target. In particular, the present invention relates to a tantalum sputtering target that is used for forming a Ta film or a TaN film as a diffusion barrier layer of a copper wiring in an LSI, and to a method for producing such a tantalum sputtering target.

Conventionally, aluminum was used as the wiring material of semiconductor devices, but pursuant to the miniaturization and higher integration of the devices, the problem of wiring delay became an issue, and copper having smaller electrical resistance than aluminum is now being used. While copper is extremely effective as a wiring material, since copper itself is an active metal, there is a problem in that copper diffuses and contaminates the interlayer insulating film, and it is necessary to form a diffusion barrier layer made from a Ta film or a TaN film between the copper wiring and the interlayer insulating film.

Generally speaking, a Ta film or a TaN film is deposited by sputtering a tantalum target. As factors that affect the performance of a tantalum target during sputtering, it is known that the various impurities and gas components contained in the target, and the plane orientation and crystal grain size of the crystals affect the deposition rate, film thickness uniformity, generation of particles, and the like.

For example, Patent Document 1 describes improving the uniformity of the film by forming a crystal structure in which the (222) orientation is preferential from the position of 30% of the target thickness toward the central plane of the target.

Moreover, Patent Document 2 describes increasing the deposition rate and improving the uniformity of the film by causing the crystal orientation of the tantalum target to be random (no alignment to a specific crystal orientation).

Moreover, Patent Document 3 describes improving the deposition rate by selectively increasing the plane orientations of (110), (200), (211), which have a high atomic density, on the sputtering surface, and improving the uniformity by suppressing the variation in the plane orientation.

In addition, Patent Document 4 describes improving the film thickness uniformity by causing the variation in the intensity ratio of the (110) plane obtained based on X-ray diffraction, depending on the location of the sputtering surface, to be within 20%.

Moreover, Patent Document 5 describes that a round metal target having an extremely strong crystallographic texture such as (111) or (100) can be prepared by combining swaging, extrusion, rotary forging, and non-lubrication upset forging with clock rolling.

In addition, Patent Document 6 describes a method of producing a tantalum sputtering target by subjecting a tantalum ingot to forging, annealing and rolling, and, after processing the tantalum ingot into its final composition, performing annealing thereto at a temperature of 1173 K or less to obtain a tantalum sputtering target having a non-recrystallized structure of 20% or less, or 90% or less.

Moreover, Patent Document 7 discloses a technique of stabilizing the sputtering characteristics by causing the relative intensity of the peak of the sputtering surface of the target to be (110)>(211)>(200) through forging, cold rolling and other processes, and heat treatment.

In addition, Patent Document 8 describes forging a tantalum ingot, performing heat treatment two or more times during the foregoing forging process, additionally performing cold rolling, and performing recrystallization heat treatment.

Nevertheless, none of the foregoing Patent Documents describe the concept of reducing the discharge voltage of the tantalum target so that plasma can be more easily generated and improve the stability of plasma by controlling the crystal orientation on the sputtering surface of the target.

PRIOR ART DOCUMENT

Patent Document

Patent Document 1: Japanese Patent Application Publication No. 2004-107758
Patent Document 00 International Application Publication No. 2008-532765
Patent Document 6: Japanese Patent No. 4754617
Patent Document 7: International Publication No. 2011/061897
Patent Document 8: Japanese Patent No. 4714123

DISCLOSURE OF THE INVENTION

An object of this invention is to reduce the discharge voltage of the tantalum sputtering target so that plasma can be more easily generated and improve the stability of plasma by controlling the crystal orientation on the sputtering surface of the target.

In particular, an object of this invention is to provide a tantalum sputtering target that is effective in forming a diffusion barrier layer made from a Ta film or a TaN film capable of effectively preventing contamination around the wiring caused by the diffusion of active Cu.

In order to resolve the foregoing problems, the present invention provides the following invention:

1) A tantalum sputtering target, wherein, on a sputtering surface of the tantalum sputtering target, an orientation rate of a (200) plane exceeds 70%, an orientation rate of a (222) plane is 30% or less.

2) The tantalum sputtering target according to 1) above, wherein, on a sputtering surface of the tantalum sputtering target, an orientation rate of a (200) plane is 80% or more, an orientation rate of a (222) plane is 20% or less.

3) A thin film for a diffusion barrier layer formed using the sputtering target according to any one of 1) or 2) above.

4) A semiconductor device that uses the thin film for a diffusion barrier layer according to 3) above.

The present invention additionally provides:

5) A method of producing a tantalum sputtering target, wherein a molten tantalum ingot is subject to forging and recrystallization annealing, and thereafter subject to rolling and heat treatment to form a crystal structure having, on a sputtering surface of the target, an orientation rate of a (200) plane that exceeds 70%, an orientation rate of a (222) plane that is 30% or less, 6) The method of producing a tantalum sputtering target according to 5) above, wherein a molten tantalum ingot is subject to forging and recrystallization annealing, and thereafter subject to rolling and heat treatment to form a crystal structure having, on a sputtering surface of the target, an orientation rate of a (200) plane that is 80% or more, an orientation rate of a (222) plane that is 20% or less.

7) The method of producing a tantalum sputtering target according to anyone of 5) or 6) above, wherein cold rolling is performed using a rolling mill roll having a rolling mill roll diameter of 500 mm or less at a rolling speed of 10 m/min or more and a reduction exceeding 80%.

8) The method of producing a tantalum sputtering target according to anyone of 5) to 7) above, wherein heat treatment is performed at a temperature of 900° C. to 1400° C.

9) The method of producing a tantalum sputtering target according to anyone of 5) to 8) above, wherein, after rolling and heat treatment are performed, surface finishing is performed via machining or polishing.

The tantalum sputtering target of the present invention yields superior effects of reducing the discharge voltage of the tantalum target so that plasma can be more easily generated and improve the stability of plasma by controlling the crystal orientation on the sputtering surface of the target.

The tantalum sputtering target of the present invention is particularly effective in forming a diffusion barrier layer made from a Ta film or a TaN film capable of effectively preventing contamination around the wiring caused by the diffusion of active Cu.

DETAILED DESCRIPTION

The tantalum sputtering target of the present invention is characterized in increasing the orientation rate of the (200) plane and reducing the orientation rate of the (222) plane on the sputtering surface of the target.

Since the crystal structure of tantalum is a body-centered cubic lattice structure (abbreviated as BCC), the (222) plane has a shorter interatomic distance than the (200) plane, and the (222) plane is in a state where the atoms are more densely packed than the (200) plane. Thus, during sputtering, it is considered that the (222) plane discharges more tantalum atoms than the (200) plane, which in turn causes the sputter rate (deposition rate) to increase.

With the tantalum sputtering target of the present invention, the orientation rate of the (200) plane exceeds 70%, and the orientation rate of the (222) plane is less than 30%. Preferably, the orientation rate of the (200) plane is 80% or more, and the orientation rate of the (222) plane is 20% or less.

By increasing the orientation rate of the (200) plane and reducing the orientation rate of the (222) plane on the sputtering surface as described above, under normal conditions the sputter rate (deposition rate) would deteriorate. Nevertheless, when there is no need to excessively increase the deposition rate, since the tantalum target discharge voltage can be lowered, there are advantages in that plasma can be more easily generated, and plasma can be stabilized.

Normally, when depositing a tantalum film via sputtering, the voltage and current are adjusted so that the discharge can be maintained at the supplied power that was set. Nevertheless, there are cases where the current decreases due to some reason or other and the voltage increases in order to maintain the power at a constant value, and this kind of state is generally referred to as a discharge abnormality.

The present invention is able to suppress the generation of discharge abnormalities during sputtering as described above by controlling the crystal orientation on the sputtering surface of the tantalum sputtering target, and thereby reduce the discharge voltage of the sputtering target and stabilize the plasma. In particular, it is possible to cause the discharge voltage to be 620 V or less and cause the variation in the discharge voltage to be 20 V or less, and the discharge abnormality occurrence rate can thereby be reduced.

In the present invention, the term "orientation rate" refers to the intensity ratio of a specific plane orientation when the measured intensity of the respective diffraction peaks of (110), (200), (211), (310), (222), (321) obtained with the X-ray diffraction method are standardized, and the sum of the intensities of the respective plane orientations is 100. Note that JCPDS (Joint Committee for Powder Diffraction Standard) was used for the standardization.

For example, the orientation rate (%) of the (200) plane will be {(measured intensity of (200)/JCPDS intensity of (200))/Σ(measured intensity of respective planes/JCPDS intensity of respective planes)}×100.

The tantalum sputtering target of the present invention may be used for forming a diffusion barrier layer made from a Ta film or a TaN film in a copper wiring. Even in cases of introducing nitrogen into the sputtering atmosphere to deposit a TaN film, the sputtering target of the present invention yields superior effects of reducing the discharge voltage of the tantalum target so that plasma can be more easily generated and improving the stability of plasma by controlling the crystal orientation on the sputtering surface of the target. Thus, the present invention can improve the production yield in the formation of copper wirings comprising a diffusion barrier layer made from a Ta film or a TaN film, and in the manufacture of semiconductor devices comprising such as a copper wiring.

The tantalum sputtering target of the present invention is produced according to the following processes. To illustrate an example, foremost, high purity tantalum having a purity of 4N (99.99%) or higher is normally used as the tantalum raw material. The tantalum raw material is melted via electron beam melting or the like and subsequently cast to prepare an ingot or a billet. Subsequently, the ingot or the billet is subject to forging, and recrystallization annealing. Specifically, for example, the ingot or the billet is subject to extend forging—annealing at a temperature of 1100 to 1400° C.—cold forging (primary forging)—annealing at a temperature of recrystallization temperature to 1400° C.—cold forging (secondary forging)—annealing at a temperature of recrystallization temperature to 1400° C.

Cold rolling is subsequently performed. The orientation rate of the tantalum sputtering target of the present invention can be controlled by adjusting the cold rolling conditions. Specifically, a rolling mill roll with a small roll diameter should be used, and preferably the roll diameter is 500 mm or less. Moreover, the rolling speed should be as fast as possible, and preferably 10 m/min or more. In addition, when rolling is only performed once, the reduction is preferably high and in excess of 80%, and when rolling is to be repeated two or more times, the reduction needs to be 60% or higher so that the ultimate thickness of the target becomes the same as the case of only performing rolling once. Desirably, the total amount of reduction exceeds 80%.

Heat treatment is subsequently performed. The orientation rate of the tantalum sputtering target of the present invention can be controlled by adjusting the conditions of the heat treatment performed after cold rolling in addition to adjusting the cold rolling conditions. Specifically, the heat treatment temperature should be high, and preferably 900 to 1400° C. While this will also depend on the amount of strain that is introduced from the rolling process, heat treatment needs to be performed at a temperature of 900° C. or higher in order to obtain a recrystallized structure. Meanwhile, to perform heat treatment at a temperature that exceeds 1400° C. is undesirable in terms of cost. Subsequently, the surface of the target is subject to surface finishing via machining or polishing in order to obtain the final product.

The tantalum target is produced based on the foregoing production processes, but what is particularly important in the present invention is to increase the orientation rate of the (200) plane and decrease the orientation rate of the (222) plane in the crystal orientation on the sputtering surface of the target.

The rolling process is mainly responsible for controlling the orientation. In the rolling process, it is possible to change the amount and distribution of strain that is introduced from the rolling process by controlling parameters such as the diameter of the rolling mill roll, rolling speed, and reduction, and the orientation rate of the (200) plane and the orientation rate of the (222) plane can thereby be controlled.

In order to effectively adjust the crystal grain size or the orientation rate, the condition setting needs to be repeated a certain number of times, but once the orientation rate of the (200) plane and that of the (222) plane are adjusted, targets having constant characteristics, i.e., characteristics of a constant level can be produced by setting the manufacturing conditions.

Normally, upon producing a target, it is effective to use a rolling mill roll having a rolling mill roll diameter of 500 mm or less, set the rolling speed to 10 m/min or more, set the reduction of 1 pass to 8 to 12%. Nevertheless, the production process is not necessarily limited to the foregoing production process so as long as the production process can achieve the crystal orientation of the present invention. In the series of processes, a condition setting of destroying the cast structure via forging and rolling and sufficiently performing recrystallization is effective.

In addition, after subjecting the molten tantalum ingot or billet to forging, rolling and other processes, the product is desirably subject to recrystallization annealing to obtain a fine and uniform structure.

EXAMPLES

The present invention is now explained based on the Examples. The following Examples are provided to facilitate the understanding of the present invention, and the present invention is not in any way limited by these Examples. In other words, modifications and other examples based on the technical concept of the present invention are obviously covered by the present invention.

A tantalum raw material having a purity of 99.995% was subject to electron beam melting and casting to obtain an ingot having a diameter of 195 mmφ. Subsequently, the ingot was subject to extend forging at room temperature to obtain a diameter of 150 mmφ, and the product was subject to recrystallization annealing at a temperature of 1100 to 1400° C. The product was once again subject to forging at room temperature to obtain a thickness of 100 mm and a diameter of 150 mmφ (primary forging), and the product was subject to recrystallization annealing at a temperature of recrystallization temperature to 1400° C. In addition, the product was subject to forging at room temperature to obtain a thickness of 70 to 100 mm and a diameter of 150 to 185 mmφ (secondary forging), and the product was subject to recrystallization annealing at a temperature of recrystallization temperature to 1400° C. to obtain a target material.

Example 1

In Example 1, the obtained target material was subject to cold rolling using a rolling mill roll having a diameter of 400 mm at a rolling speed of 10 m/min, and a total reduction of 86% to obtain a thickness of 14 mm and a diameter of 520 mmφ. The product was subject to heat treatment at a temperature of 1000° C. Subsequently, the surface of the product was machined and polished to obtain a target.

Based on the foregoing processes, it was possible to obtain a tantalum sputtering target having a crystal structure in which the orientation of the (200) plane is 84.3% and the orientation rate of the (222) plane is 9.9%.

As a result of sputtering this sputtering target, the discharge voltage was 613.5 V, the discharge voltage variation was 7.1 V, and the discharge abnormality occurrence rate was favorable at 3.5%. The results are shown in Table 1.

Normally, upon calculating the discharge abnormality occurrence rate, the number of times that the voltage reached 1000 V as the upper limit of the power source is divided by the total number of discharges, and in this Example also, the discharge abnormality occurrence rate was calculated under the same conditions. The tantalum film was deposited under the following conditions (same in the ensuing Examples and Comparative Examples).

<Deposition Conditions>
Power source: DC system
Electrical power: 15 kW
Ultimate vacuum: $5 \times 10^{-8}$ Torr
Atmosphere gas composition: Ar
Sputter gas pressure: $5 \times 10^{-3}$ Torr
Sputtering time: 15 seconds Example 2

In Example 2, the obtained target material was subject to cold rolling using a rolling mill roll having a diameter of 400 mm at a rolling speed of 15 m/min, and a total reduction of 88% to obtain a thickness of 14 mm and a diameter of 520 mmφ. The product was subject to heat treatment at a temperature of 900° C. Subsequently, the surface of the product was machined and polished to obtain a target.

Based on the foregoing processes, it was possible to obtain a tantalum sputtering target having a crystal structure in which the orientation of the (200) plane is 77.7% and the orientation rate of the (222) plane is 16.2%.

As a result of sputtering this sputtering target, the discharge voltage was 614.7 V, the discharge voltage variation was 12.3 V, and the discharge abnormality occurrence rate was favorable at 5.8%. The results are shown in Table 1.

Example 3

In Example 3, the obtained target material was subject to cold rolling using a rolling mill roll having a diameter of 400 mm at a rolling speed of 20 m/min, and a total reduction of 82% to obtain a thickness of 14 mm and a diameter of 520 mmφ. The product was subject to heat treatment at a temperature of 1100° C. Subsequently, the surface of the product was machined and polished to obtain a target.

Based on the foregoing processes, it was possible to obtain a tantalum sputtering target having a crystal structure in which the orientation of the (200) plane is 74.3% and the orientation rate of the (222) plane is 14.8%.

As a result of sputtering this sputtering target, the discharge voltage was 603.2 V, the discharge voltage variation was 18.2 V, and the discharge abnormality occurrence rate was favorable at 6.0%. The results are shown in Table 1.

Example 4

In Example 4, the obtained target material was subject to cold rolling using a rolling mill roll having a diameter of 500 mm at a rolling speed of 15 m/min, and a total reduction of 90% to obtain a thickness of 14 mm and a diameter of 520 mmφ. The product was subject to heat treatment at a temperature of 800° C. Subsequently, the surface of the product was machined and polished to obtain a target.

Based on the foregoing processes, it was possible to obtain a tantalum sputtering target having a crystal structure in which the orientation of the (200) plane is 71.4% and the orientation rate of the (222) plane is 20.7%.

As a result of sputtering this sputtering target, the discharge voltage was 614.1 V, the discharge voltage variation was 15.3 V, and the discharge abnormality occurrence rate was favorable at 7.0%. The results are shown in Table 1.

Example 5

In Example 5, the obtained target material was subject to cold rolling using a rolling mill roll having a diameter of 500 mm at a rolling speed of 20 m/min, and a total reduction of 84% to obtain a thickness of 14 mm and a diameter of 520 mmφ. The product was subject to heat treatment at a temperature of 1400° C. Subsequently, the surface of the product was machined and polished to obtain a target.

Based on the foregoing processes, it was possible to obtain a tantalum sputtering target having a crystal structure in which the orientation of the (200) plane is 70.8% and the orientation rate of the (222) plane is 19.7%.

As a result of sputtering this sputtering target, the discharge voltage was 611.2 V, the discharge voltage variation was 12.2 V, and the discharge abnormality occurrence rate was favorable at 8.1%. The results are shown in Table 1.

Comparative Example 1

In Comparative Example 1, the obtained target material was subject to cold rolling using a rolling mill roll having a diameter of 650 mm at a rolling speed of 15 m/min, and a total reduction of 80% to obtain a thickness of 14 mm and a diameter of 520 mmφ. The product was subject to heat treatment at a temperature of 800° C. Subsequently, the surface of the product was machined and polished to obtain a target.

Based on the foregoing processes, it was possible to obtain a tantalum sputtering target having a crystal structure in which the orientation of the (200) plane is 43.6% and the orientation rate of the (222) plane is 39.1%.

As a result of sputtering this sputtering target, the discharge voltage was 622.5 V, the discharge voltage variation was 17.0 V, and the discharge abnormality occurrence rate was inferior at 16.6%. The results are shown in Table 1.

Comparative Example 2

In Comparative Example 2, the obtained target material was subject to cold rolling using a rolling mill roll having a diameter of 500 mm at a rolling speed of 10 m/min, and a total reduction of 78% to obtain a thickness of 14 mm and a diameter of 520 mmφ. The product was subject to heat treatment at a temperature of 800° C. Subsequently, the surface of the product was machined and polished to obtain a target.

Based on the foregoing processes, it was possible to obtain a tantalum sputtering target having a crystal structure in which the orientation of the (200) plane is 60.1% and the orientation rate of the (222) plane is 24.0%.

As a result of sputtering this sputtering target, the discharge voltage was 627.0 V, the discharge voltage variation was 18.0 V, and the discharge abnormality occurrence rate was inferior at 20.5%. The results are shown in Table 1.

Comparative Example 3

In Comparative Example 3, the obtained target material was subject to cold rolling using a rolling mill roll having a diameter of 500 mm at a rolling speed of 15m/min, and a total reduction of 85% to obtain a thickness of 14 mm and a diameter of 520 mmφ. The product was subject to heat treatment at a temperature of 800° C. Subsequently, the surface of the product was machined and polished to obtain a target.

Based on the foregoing processes, it was possible to obtain a tantalum sputtering target having a crystal structure in which the orientation of the (200) plane is 51.4% and the orientation rate of the (222) plane is 37.3%.

As a result of sputtering this sputtering target, the discharge voltage was 624.0 V, the discharge voltage variation was 25.1 V, and the discharge abnormality occurrence rate was inferior at 26.2%. The results are shown in Table 1.

Comparative Example 4

In Comparative Example 4, the obtained target material was subject to cold rolling using a rolling mill roll having a diameter of 650 mm at a rolling speed of 20 m/min, and a total reduction of 86% to obtain a thickness of 14 mm and a diameter of 520 mmφ. The product was subject to heat treatment at a temperature of 1000° C. Subsequently, the surface of the product was machined and polished to obtain a target.

Based on the foregoing processes, it was possible to obtain a tantalum sputtering target having a crystal structure in which the orientation of the (200) plane is 66.2% and the orientation rate of the (222) plane is 31.0%.

As a result of sputtering this sputtering target, the discharge voltage was 603.4 V, the discharge voltage variation was 28.4 V, and the discharge abnormality occurrence rate was inferior at 18.3%. The results are shown in Table 1.

As shown in the foregoing Examples and Comparative Examples, those within the range of the conditions of the present invention yield effects of reducing the discharge voltage of the tantalum target so that plasma can be more easily generated and improve the stability of the plasma. In other words, in comparison to the Comparative Examples, superior effects are yielded in that the discharge voltage can be reduced, variation in the discharge voltage can be suppressed, and the discharge abnormality occurrence rate can also be reduced.

TABLE 1

|  | (200) orientation rate (%) | (222) orientation rate (%) | Discharge voltage (V) | Maximum (V) | Minimum (V) | Discharge voltage variation (V) | Discharge abnormality occurrence rate (%) |
| --- | --- | --- | --- | --- | --- | --- | --- |
| Example 1 | 84.3 | 9.9 | 613.5 | 615.3 | 608.2 | 7.1 | 3.5 |
| Example 2 | 77.7 | 16.2 | 614.7 | 621.0 | 608.7 | 12.3 | 5.8 |

TABLE 1-continued

|  | (200) orientation rate (%) | (222) orientation rate (%) | Discharge voltage (V) | Maximum (V) | Minimum (V) | Discharge voltage variation (V) | Discharge abnormality occurrence rate (%) |
|---|---|---|---|---|---|---|---|
| Example 3 | 74.3 | 14.8 | 603.2 | 614.5 | 596.3 | 18.2 | 6.0 |
| Example 4 | 71.4 | 20.7 | 614.1 | 616.4 | 601.1 | 15.3 | 7.0 |
| Example 5 | 70.8 | 19.7 | 611.2 | 615.3 | 603.1 | 12.2 | 8.1 |
| Comparative Example 1 | 43.6 | 39.1 | 622.5 | 631.0 | 614.0 | 17.0 | 16.6 |
| Comparative Example 2 | 60.1 | 24.0 | 627.0 | 636.0 | 618.0 | 18.0 | 20.5 |
| Comparative Example 3 | 51.4 | 37.3 | 624.0 | 636.5 | 611.4 | 25.1 | 26.2 |
| Comparative Example 4 | 66.2 | 31.0 | 603.4 | 620.7 | 592.3 | 28.4 | 18.3 |

The present invention provides a tantalum sputtering target, and by controlling the crystal orientation on the sputtering surface of the target, effects are yielded in that the discharge voltage of the tantalum sputtering target can be reduced so that plasma can be more easily generated, and the stability of the plasma can be improved. The tantalum sputtering target of the present invention is particularly effective in forming a diffusion barrier layer made from a Ta film or a TaN film capable of effectively preventing contamination around the wiring caused by the diffusion of active Cu.

The invention claimed is:

1. A tantalum sputtering target having a sputtering surface consisting of crystal grains having a (200) plane orientation, crystal grains having a (222) plane orientation, and crystal grains having orientations other than (200) and (222) plane orientations, wherein the sputtering surface has an orientation rate of (200) plane of 70.8% to 84.3% an orientation rate of (222) plane of 9.9% to 20.7%, and a sum of orientation ratios of (110), (211), (310) and (321) planes of 5.8% to 10.9%, where the orientation rates of (200) plane and (222) plane are calculated from measured strengths of X-ray diffraction peaks of specified planes, which are (110), (200), (211), (310), (222) and (321) planes, and are defined respectively as (measured intensity of the peak of (200) plane/JCPDS intensity of (200) plane)/(Σ(measured intensity of one of the specified planes/JCPDS intensity of the same one of the specified planes))×100 and as (measured intensity of the peak of (222) plane/JCPDS intensity of (222) plane)/(Σ(measured intensity of one of the specified planes/JCPDS intensity of the same one of the specified planes))×100, where JCPDS refers to Joint Committee for Powder Diffraction and Σ means the summation of all of the specified planes.

2. A method of producing a tantalum sputtering target, wherein a molten tantalum ingot is subject to forging and recrystallization annealing, and thereafter subject to rolling and heat treatment to form a tantalum sputtering target having a crystal structure providing a sputtering surface consisting of crystal grains having a (200) plane orientation, crystal grains having a (222) plane orientation, and crystal grains having orientations other than (200) and (222) plane orientations, and with an orientation rate of (200) plane of 70.8% to 84.3%, an orientation rate of (222) plane of 9.9% to 20.7%, and a sum of orientation ratios of (110), (211), (310) and (321) planes of 5.8% to 10.9%, where the orientation rates of (200) plane and (222) plane are calculated from measured strengths of X-ray diffraction peaks of specified planes, which are (110), (200), (211), (310), (222) and (321) planes, and are defined respectively as (measured intensity of the peak of (200) plane/JCPDS intensity of (200) plane)/(Σ(measured intensity of one of the specified planes/JCPDS intensity of the same one of the specified planes))×100 and as (measured intensity of the peak of (222) plane/JCPDS intensity of (222) plane)/(Σ(measured intensity of one of the specified planes/JCPDS intensity of the same one of the specified planes))×100, where JCPDS refers to Joint Committee for Powder Diffraction and Σ means the summation of all of the specified planes.

3. The method of producing a tantalum sputtering target according to claim 2, wherein the rolling is cold rolling performed using a rolling mill roll having a rolling mill roll diameter of 500 mm or less at a rolling speed of 10 m/min or more and a reduction exceeding 80%.

4. The method of producing a tantalum sputtering target according to claim 3, wherein the heat treatment is performed at a temperature of 900°C. to 1400°C.

5. The method of producing a tantalum sputtering target according to claim 4, wherein, after the rolling and heat treatment are performed, surface finishing is performed via machining or polishing.

6. The method according to claim 2, wherein the heat treatment is performed at a temperature of 900°C. to 1400°C.

7. The method of producing a tantalum sputtering target according to claim 2, wherein, after the rolling and heat treatment are performed, surface finishing is performed via machining or polishing.

8. A tantalum sputtering target having a sputtering surface consisting of crystal grains having a (200) plane orientation, crystal grains having a (222) plane orientation, and crystal grains having orientations other than (200) and (222) plane orientations, wherein the sputtering surface has an orientation rate of (200) plane of 70.8% to 84.3%, an orientation rate of (222) plane of 9.9% to 20.7%, and a sum of orientation rates of (110), (211), (310) and (321) planes of 5.8% to 10.9%, where the orientation rates are calculated from measured strengths of X-ray diffraction peaks of (110), (200), (211), (310), (222) and (321) planes.

* * * * *